(12) United States Patent
Francisquini

(10) Patent No.: US 12,107,398 B2
(45) Date of Patent: Oct. 1, 2024

(54) STRUCTURAL PROFILE FOR ELECTRICAL CABINET

(71) Applicant: Melquisedec Francisquini, Sao Paulo II (BR)

(72) Inventor: Melquisedec Francisquini, Sao Paulo II (BR)

( * ) Notice: Subject to any disclaimer, the term of this patent is extended or adjusted under 35 U.S.C. 154(b) by 415 days.

(21) Appl. No.: 17/614,239

(22) PCT Filed: May 26, 2020

(86) PCT No.: PCT/BR2020/050183
§ 371 (c)(1),
(2) Date: Nov. 24, 2021

(87) PCT Pub. No.: WO2020/237337
PCT Pub. Date: Dec. 3, 2020

(65) Prior Publication Data
US 2022/0216675 A1    Jul. 7, 2022

(30) Foreign Application Priority Data

May 28, 2019   (BR) .......................... 102019010955-6

(51) Int. Cl.
*H02B 1/01* (2006.01)
*H02B 1/30* (2006.01)

(52) U.S. Cl.
CPC ............. *H02B 1/013* (2013.01); *H02B 1/014* (2013.01); *H02B 1/301* (2013.01)

(58) Field of Classification Search
CPC ......... H02B 1/013; H02B 1/014; H02B 1/301
See application file for complete search history.

(56) References Cited

U.S. PATENT DOCUMENTS

| | | | | |
|---|---|---|---|---|
| 5,202,818 A | * | 4/1993 | Betsch ................... | H02B 1/301 361/829 |
| 6,231,142 B1 | * | 5/2001 | Pochet ................... | H02B 1/308 312/265.3 |
| 6,808,240 B2 | * | 10/2004 | Altena ................... | H02B 1/01 312/265.2 |
| 7,441,847 B2 | * | 10/2008 | Francisquini .......... | H02B 1/308 312/265.3 |
| 2002/0121387 A1 | * | 9/2002 | Suzuki ................... | H02B 1/01 174/50 |
| 2003/0048048 A1 | * | 3/2003 | Altena ................... | H02B 1/01 312/265.3 |
| 2003/0172613 A1 | * | 9/2003 | Fontana ................. | H02B 1/306 52/282.1 |

(Continued)

FOREIGN PATENT DOCUMENTS

| | | |
|---|---|---|
| BR | PI0301083 A | 11/2004 |
| BR | PI0701427 A2 | 11/2008 |

(Continued)

*Primary Examiner* — Rockshana D Chowdhury
*Assistant Examiner* — Douglas R Burtner
(74) *Attorney, Agent, or Firm* — Cowan, Liebowitz & Latman, P.C.

(57) ABSTRACT

The "STRUCTURAL PROFILE FOR ELECTRICAL CABINET" comprises a profile that presents a front sealing area and is positioned in relation thereto at 90°, a side sealing area, an inner fixing wall, an inner fixing side, an inner fixing tab, an outer fixing wall, an outer fixing side and a central barrier.

19 Claims, 3 Drawing Sheets

(56) References Cited

U.S. PATENT DOCUMENTS

| | | | |
|---|---|---|---|
| 2005/0174020 A1* | 8/2005 | Francisquini | H02B 1/01 |
| | | | 312/265.3 |
| 2006/0162946 A1* | 7/2006 | Hartel | H05K 7/20781 |
| | | | 174/9 F |
| 2007/0175648 A1* | 8/2007 | Francisquini | H02B 1/01 |
| | | | 174/50 |
| 2010/0178455 A1* | 7/2010 | Shen | H02B 1/01 |
| | | | 428/134 |
| 2013/0221813 A1* | 8/2013 | Maisch | A47B 87/00 |
| | | | 312/107 |
| 2016/0352082 A1* | 12/2016 | Boehme | H02B 1/013 |
| 2018/0116400 A1* | 5/2018 | Lu | H05K 7/1488 |
| 2018/0375302 A1* | 12/2018 | Reuter | H02B 1/013 |
| 2019/0008068 A1* | 1/2019 | Donaldson | A47B 88/497 |
| 2019/0214798 A1* | 7/2019 | Schindler | H02B 1/303 |
| 2020/0124078 A1* | 4/2020 | Brück | H02B 1/012 |
| 2022/0320837 A1* | 10/2022 | Francisquini | H02B 1/28 |
| 2023/0109751 A1* | 4/2023 | Francisquini | H01B 5/02 |
| | | | 361/624 |

FOREIGN PATENT DOCUMENTS

| | | |
|---|---|---|
| EP | 0599111 A1 | 6/1994 |
| WO | 2003105552 A2 | 12/2003 |
| WO | 2015117597 A1 | 8/2015 |

\* cited by examiner

FIG. 3
FIG. 4
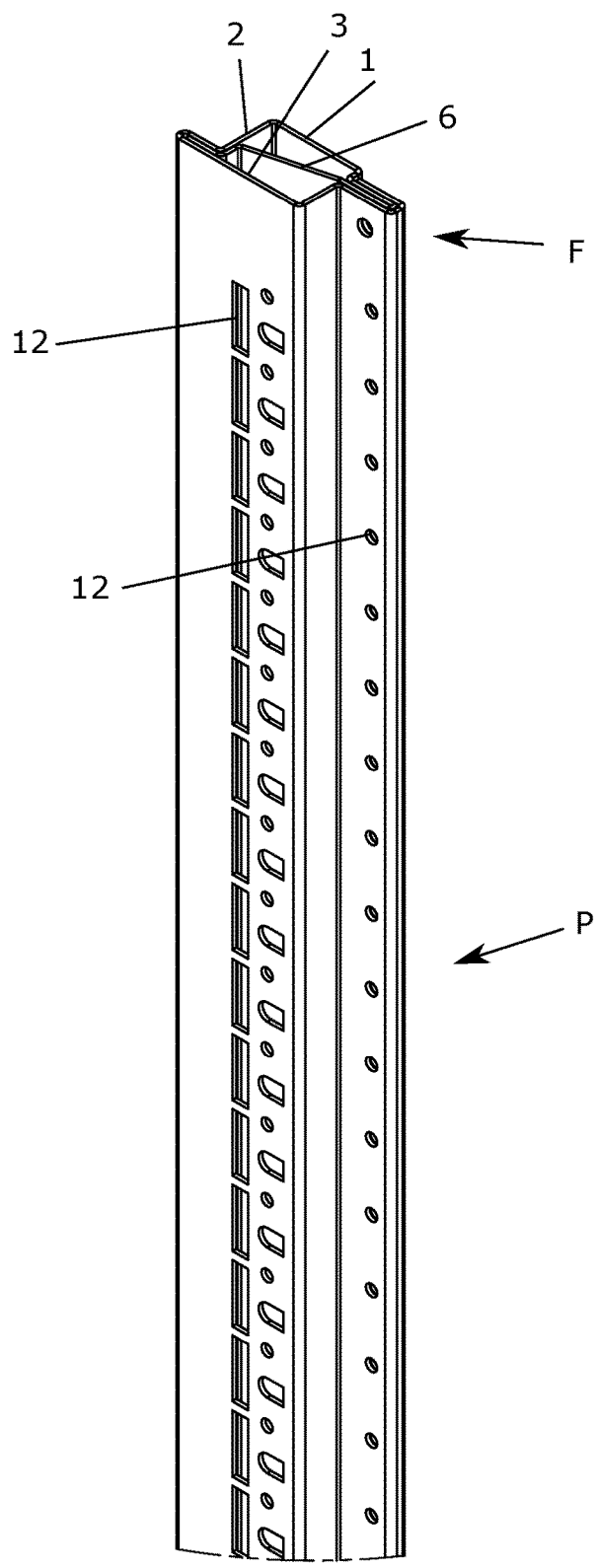
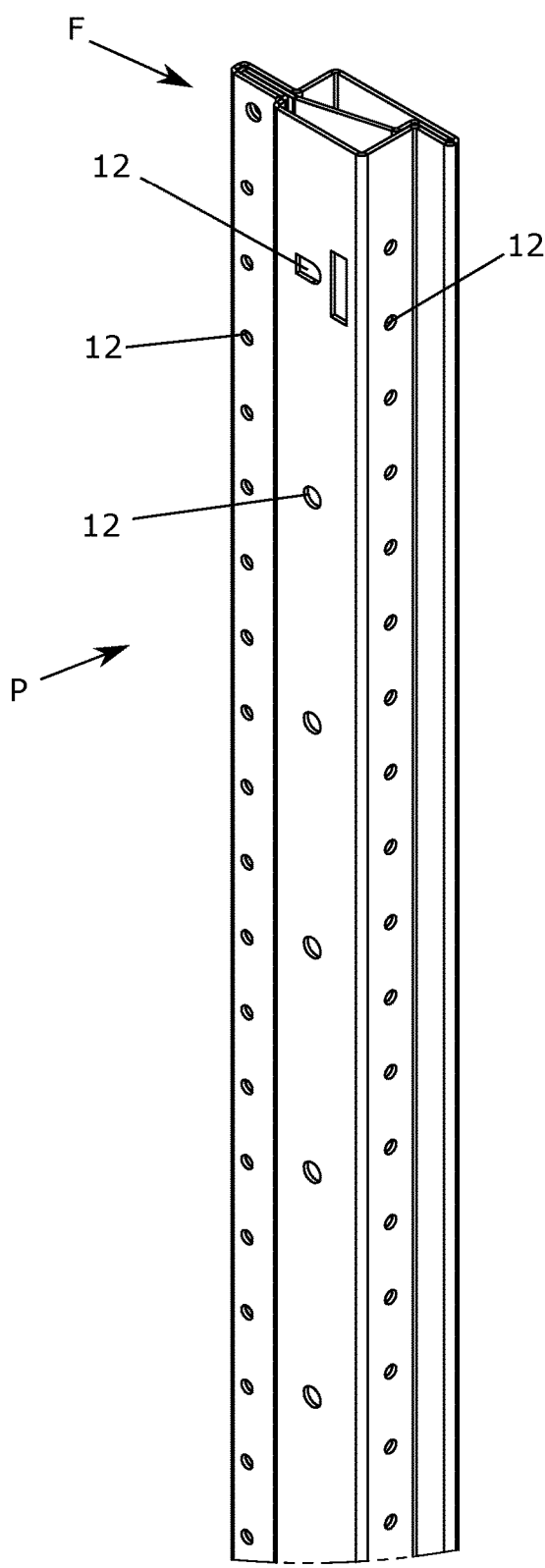

STRUCTURAL PROFILE FOR ELECTRICAL CABINET

FIELD OF APPLICATION

The present invention pertains to the field of application of metal profiles for structural elements, more precisely, to the field of metal profiles for electrical cabinets and cupboards.

DESCRIPTION OF THE STATE OF THE ART

Electrical cabinets and cupboards are widely used in the industry. Their basic functions consist of providing useful area for the assembly of electrical and electronic components, preventing improper access to these components by unauthorized persons, and in some cases protecting such electrical and electronic components from dust and external moisture.

Several types of structure are used in the construction of electrical cabinets, such as welded, fused, tubular and metal profiles structures. Metal profiles are an important form of construction, being widely used for the manufacture of cabinets because they are easy to handle, and can also be easily transported and assembled at the installation site.

In view of their industrial application and the high currents and voltages to which they are subjected, some electrical cabinets have a series of safety regulations, which are designed to attest to their ability to resist possible short circuits, without spreading flames or exploding. Therefore, metal profiles, together with the other elements that form the structure of the electrical cabinet, should be able to promote the insulation of the inside of the electrical cabinet from the outside environment.

Another important feature in profiles for electrical cabinets is the space they occupy. The larger the space occupied by the profile, the smaller the usable area to be used with the components to be assembled. In this way, in addition to meeting the needs of assembling components and providing a solid structure, it is important that the profile is compact and provides the largest possible usable area.

The state of the art presents profiles with various formats and characteristics. Among them, it is possible to mention those described in documents U.S. Pat. Nos. 6,231,142, 6,808,240, WO2003105552 and WO2015117597.

Document U.S. Pat. No. 6,231,142 presents a complex format profile, with several edges that make it difficult to construct. In addition, said profile presents several curves and changes of direction of its sides, occupying a large space and consequently making the useful area of the cabinet smaller. Another problem of the cabinet presented in said document is that its sealing can be compromised by the holes for fixation, which consequently can cause infiltrations.

Document WO2015117597 presents a very simple profile; however, if it is manufactured in folded sheet metal, welding will be needed to confer structural rigidity. Another problem of the profile of this document is in its sealing areas, which are narrow, which consequently can allow infiltrations. Structural fragility is a problem of the profile presented in said document, resulting from the absence of internal elements that attribute rigidity to said profile, such fragility leads to the need to use a larger profile, which consequently decreases the useful area inside the cabinet.

Thus, it is possible to see that the solutions presented in the state of the art do not fully solve the condition of offering a metal profile that is easy manufacture and which does not require the need for welding, in addition, there is a failure to offer a profile that occupies the least possible space and consequently offers greater usable area inside the cabinet. Lastly, no profile is offered that provides total insulation between the internal and external areas.

BRIEF DESCRIPTION OF THE INVENTION

The present invention refers to a metal profile that is easy to manufacture, with its own geometry and high structural rigidity, which allows its use with smaller width, thus offering the largest usable area of assembly inside the cabinet.

One objective of the present invention is to provide a metal profile without welds.

Another objective of the present invention is to provide a metal profile capable of providing high degree of insulation between the internal and external areas of the electrical cabinet.

It is a further objective of this invention to provide an easy-to-make and low-cost metal profile.

Another objective of this invention is to provide a metal profile that provides ease of assembly of the electrical cabinet and of the internal and external components installed therein.

Finally, it is an objective of the present invention to provide a metal profile that occupies less space in transportation, storage and, mainly, that presents the largest useful area inside the cabinet.

BRIEF DESCRIPTION OF THE DRAWINGS

The subject matter of this specification will be fully clear in its technical aspects from the detailed description that will be made based on the drawings listed below, wherein:

FIG. 3 shows a view in a rear perspective of an embodiment of the profile, where it is possible to observe the means of fixing on the inner fixing wall and on the inner fixing tab;

FIG. 4 shows a front perspective view of an embodiment of the profile, where it is possible to observe another variation of means of fixing the external parts;

DETAILED DESCRIPTION OF THE INVENTION

Figure 1:
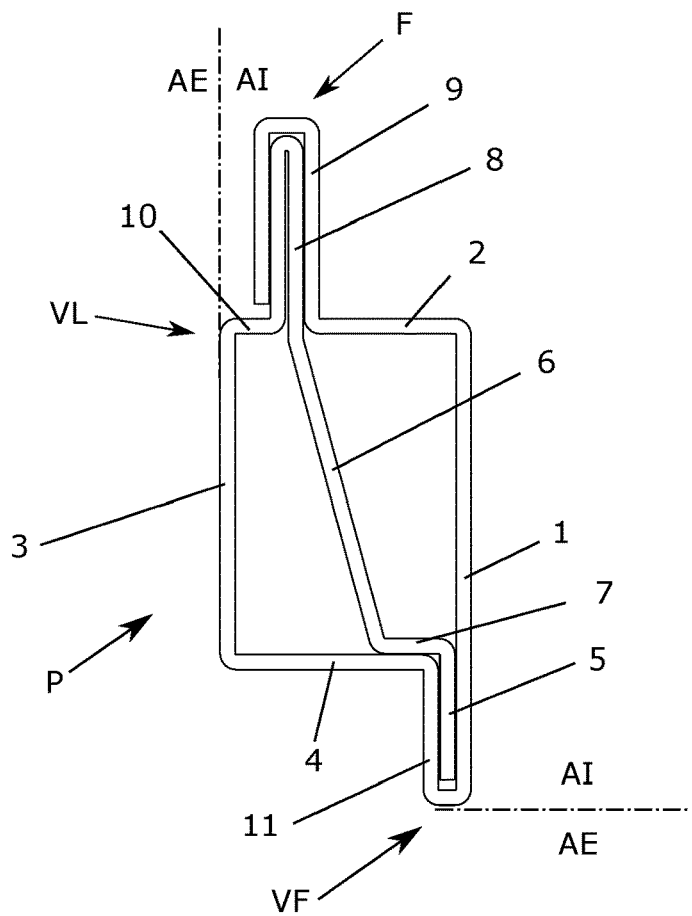
FIG. 1 shows a top view of an embodiment of the profile, where it is possible to observe the construction in single folded plate with overlapping layers forming a closed tubular profile.

In accordance with the figures mentioned, the present invention "STRUCTURAL PROFILE FOR ELECTRICAL CABINET" comprises the profile (P) which presents a front sealing area (VF) and positioned in relation thereto, preferably at 90°, a side sealing area (VL), a central barrier (6), an inner fixing wall (1), an inner fixing side (2), an inner fixing tab (F), an outer fixing wall (3) and an outer fixing side (4) provide areas for fixing elements, both inside and outside the cabinet, besides giving structural rigidity to the profile.

The inner fixing wall (1) and the inner fixing side (2) are connected to each other forming an angle of 90°.

Said inner fixing wall (1) presents on its opposite the inner fixing side (2), the sealing tab (11). Said sealing tab (11) is a U-shaped portion that presents, as one of its tabs, the continuation of the inner fixing wall (1). Pressed between its sides, said sealing tab (11) has the initial crimping tab (5). At its curved end, the sealing tab (11) has the front sealing area (VF).

The initial crimping tab (5) has connected to it the connecting side (7), forming an angle of 90° between them. Said connecting side (7) moves away from the inner fixing wall (1) until it connects with the central barrier.

Such a central barrier (6) moves toward the inner fixing side (2) and moves away from the inner fixing wall (1). When approaching the inner fixing side (2), said central barrier (6) connects to the first side of the inner tab (8), forming an obtuse angle between them. Said inner tab (8) forms an angle of 90° in relation to the inner fixing side (2).

The inner tab (8) presents a fold, making an angle of 180°, and presents a second side connected to the spacing side (10) which is parallel to the inner fixing side (2), preferably on the same plane.

A said spacing side (10) connects, forming an angle of 90°, with the outer fixing wall (3). Such outer fixing wall (3) is positioned parallel to the inner fixing wall (1), preferably having the same length.

Said outer fixing wall (3) has in its portion near the spacing side (10), the side sealing area (VL), which is the region without holes where sealing occurs.

The outer fixing wall (3) connects, forming an angle of 90°, with the outer fixing side (4), which is opposite and parallel to the spacing side (10). In its final portion, at the end opposite the outer fixing wall (3), said outer fixing side (4) and said connecting side (7) abut, until said outer fixing side (4) connects to one of the sides of the sealing tab (11).

Around the inner tab (8) is positioned the outer tab (9), which is also U-shaped. Said outer tab (9) has one of its sides connected to the inner fixing side (2). The other side of the outer tab (9) is the tab for final crimping of the profiling. Said inner and outer tabs (8 and 9) form the four-fold layer called fixing tab (F).

The inner fixing wall (1), the inner fixing side (2), the spacing side (10), outer fixing wall (3) and the outer fixing side (4), form essentially a quadrangle, preferably rectangular, with the central barrier (6) crossing its interior diagonally or partially diagonally, as shown in FIG. 1.

The inner and outer fixing walls (1 and 3), the inner and outer fixing sides (2 and 4), as well as the fixing tab (F) have means of fixing (12), which are preferably holes, and can also comprise other elements, such as nuts or studs. The holes can be of various shapes, preferably the combination between circular, rectangular and semi-oblong formats. The use of holes or the combination of these and nuts or studs throughout the profile (P) provides the possibility of installation and change of position of any element, without requiring additional drilling in the profile (P), since additional perforations would require the components to be protected against sparks and filings, and possibly require that other parts be disassembled.

In the preferred embodiment of the present invention, the profile (P) is constructed in single folded plate, presenting the initial crimping tab (5) as one of its ends and the outer tab (9), as its other end, without the need for welding.

Figure 2:
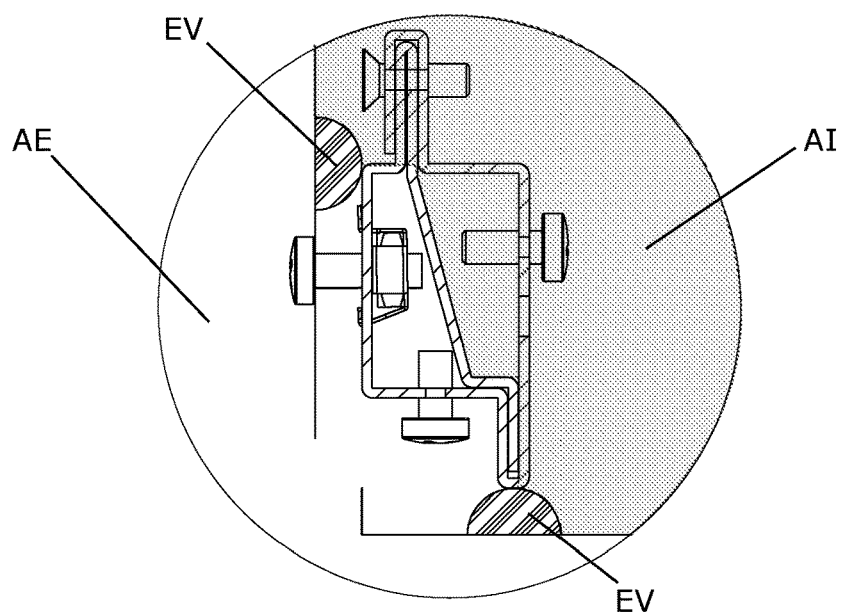
FIG. 2 shows a detail of the assembly of panels in the profile with the use of sealing elements, where it is possible to observe the delimitation between the inner and outer areas.
Figure 5:
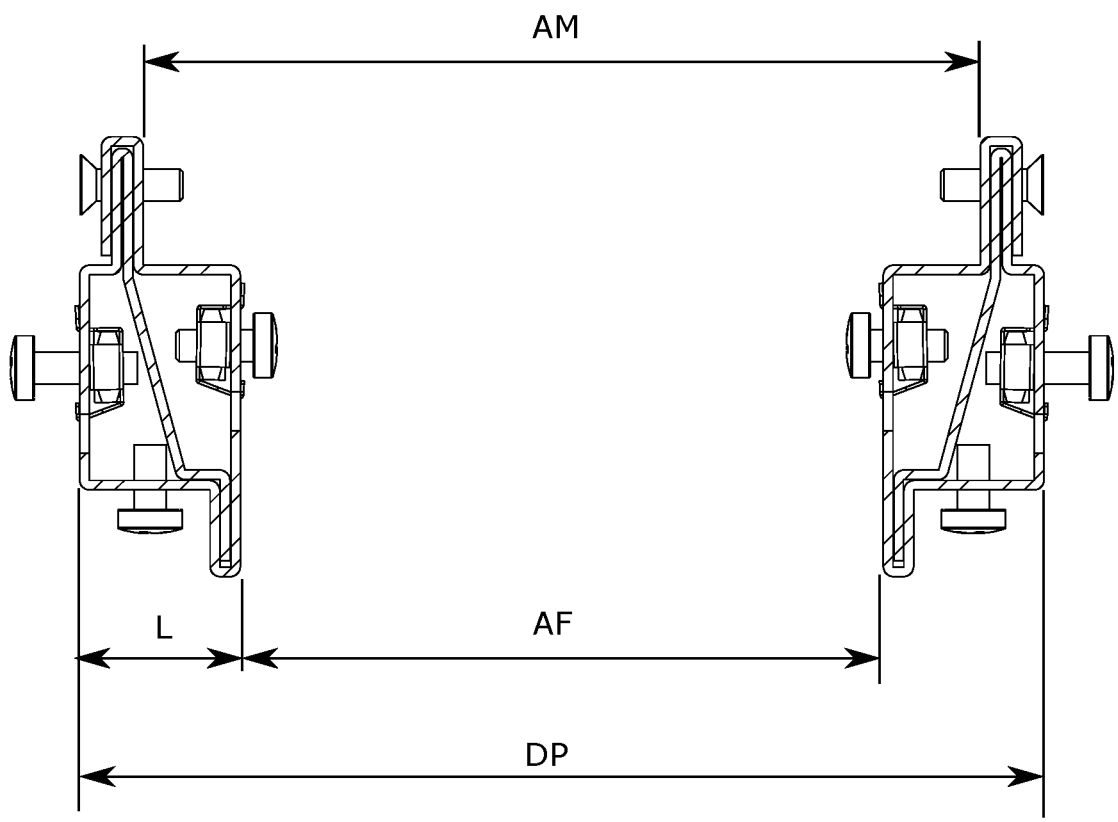
FIG. 5 shows a cut-off top view of an embodiment of the profile, where it is possible to observe the width of the profile, the assembly amplitude, front opening that said profile provides in an electrical cabinet for the given standard size.

The profile (P) is capable of providing total insulation of the assembly holes and cutouts between the internal areas (AI) and external areas (AE) through the front and side sealing areas (VF and VL), the central barrier (6) and any sealing element (EV) used in the assembly of the cabinet, as shown in FIG. 2. In addition to the mechanical separation between the internal and external areas (AE and AI), the central barrier (6) provides the profile (P) the soul inside which confers greater structural rigidity.

The overlap that occurs between the inner tab (8) and the outer tab (9), forming said four-fold layer, increases the structural rigidity of the profile (P) in addition to providing a stable inner fixing tab (F). Said inner fixing tab (F) has a plurality of means for fixing (12) external elements, which are preferably holes, and can be square, rectangular, circular or else a combination thereof.

The overlap in the front sealing area (VF) and the initial crimping tab (5), which forms the triple layer, improve and guarantee the sealing, in addition to promoting a structural reinforcement in the profile (P).

The structural reinforcements promoted by the overlaps on the fixing and sealing tabs (F and 11) in addition to the existence of the central barrier (6), allow the profile (P) to be built with a smaller width (L), thus providing the largest front opening (AF) to the cabinet, such opening provides ample free frontal access, for the passage of equipment and components, besides offering greater useful area for the assembly of components in its interior. Such an increase in usable area is substantially perceived when using several cabinets or needing several profiles for the assembly of a cabinet.

Figure 6:
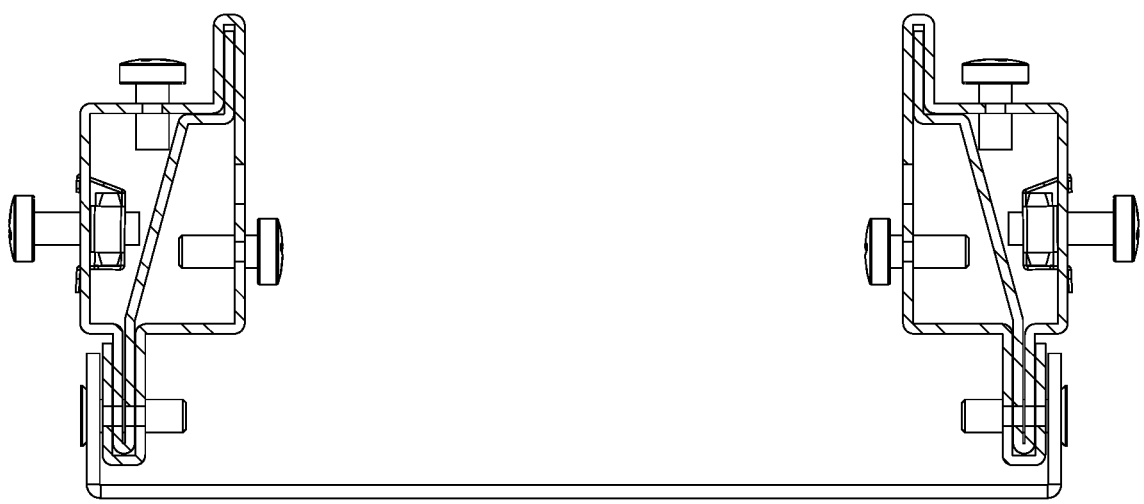
FIG. 6 shows a cut-off top view of an embodiment of the profile, with an example of assembly using the fixing tab, where it is possible to observe the use of the assembly amplitude.

In addition to the assembly of components in the inner fixing wall (1) that allows the occupation of the entire frontal opening area (AF), the present invention allows the assembly of components on the fixing tab (F) which, with its four-fold layer, offers reinforcement to withstand heavy elements and presents access to screws through both sides of the profile (P). These fixing tabs (F), delimit the assembly amplitude (AM), which is larger than the frontal opening (AF), thus offering the even larger assembly area, as shown in FIG. 6.

The present invention offers a larger front opening (AF) and greater assembly amplitude (AM), thus allowing the maximization of the useful assembly area, to the same standard size (DP), which is the external dimension that the cabinet presents. Said standard dimension (DP) is the one used as reference for electrical cabinets and many manufacturers use said dimension to name the cabinet model.

The profile arrangement (P) presented here is capable providing ease of assembly for a cabinet or electrical panel, in addition to providing total insulation between the internal and external areas (AI and AE), thus providing greater security.

The present invention also stands out for the possibility of construction without the need for welds, eliminating process steps and, consequently, reducing the cost of production.

The profile concept (P) was specifically designed with the objective of being used for the assembly of electrical cabinets, thus allowing compliance with short circuit requirements, especially the requirements of the IP54 degree of protection, in which said profile (P) does not exceed 25 mm in width.

It should be understood that the present description does not limit the application to the details described herein and that the invention is capable of other embodiments and of being practiced or executed in a variety of modes, within the scope of the claims. Although specific terms have been used, such terms should be interpreted in a generic and descriptive sense, and not for the purpose of limiting.

The invention claimed is:

1. A "STRUCTURAL PROFILE FOR ELECTRICAL CABINET" characterized in that the profile (P) presents a front sealing area (VF) and a side sealing area (VL) positioned in relation thereto at 90°; an inner fixing wall, an inner fixing side, an inner fixing tab (F), an outer fixing wall, an outer fixing side and a central barrier; wherein the inner fixing wall and the inner fixing side connected to each other forming an angle of 90°; and said inner fixing wall presents a sealing tab on an opposite side from said inner fixing side wherein the sealing tab has a U-shaped portion that presents, as one of its tabs, the continuation of the inner fixing wall and the sealing tab has a reinforcement tab pressed between its sides, and the sealing tab has at its curved end, the front sealing area (VF) wherein the reinforcement tab connects to the central barrier, wherein said central barrier, follows toward the inner fixing side moving away from the fixing wall and upon approaching the inner fixing side the central barrier connects to the first side of a inner tab, forming an obtuse angle between them.

2. The "PROFILE" according to claim 1, characterized in that between the central barrier and the reinforcement tab, said reinforcement tab has connected to it a connecting side, forming an angle of 90° between them.

3. The "PROFILE" according to claim 2, characterized in that the connecting side moves away from the inner fixing wall until it connects with the central barrier.

4. The "PROFILE" according to claim 1, characterized in that the inner tab forms an angle of 90° in relation to the inner fixing side.

5. The "PROFILE" according to claim 4, characterized in that the inner tab presents a fold, making an angle of 180°, and presents a second side connected to a spacing side, parallel to the inner fixing side and on the same plane.

6. The "PROFILE" according to claim 5, characterized in that the spacing side connects with the outer fixing wall, forming an angle of 90°.

7. The "PROFILE" according to claim 6, characterized in that the outer fixing wall is positioned parallel to the inner fixing wall, having the same width.

8. The "PROFILE" according to claim 7, characterized in that the outer fixing wall has in its portion near the spacing side, the side sealing area (VL).

9. The "PROFILE" according to claim 7, characterized in that the outer fixing wall connects to the outer fixing side forming an angle of 90°.

10. The "PROFILE" according to claim 9, characterized in that the outer fixing side is opposite and parallel to the spacing side.

11. The "PROFILE" according to claim 9, characterized in that the outer fixing side and said connecting side abut at their final portion, at the opposite end to the outer fixing wall where said outer fixing side connects to one of the sides of the sealing tab.

12. The "PROFILE" according to claim 4, characterized in that the profile (P) has around the inner tab the outer tab, latter being U-shaped.

13. The "PROFILE" according to claim 12, characterized in that the outer tab presents one of its sides connected to the inner fixing side and the other side of said outer tab is the free tab.

14. The "PROFILE" according to claim 4, characterized in that the inner tab and the outer tab form a four-fold layer, called fixing tab (F).

15. The "PROFILE" according to claim 1, characterized in that the profile (P) has the inner fixing wall, the inner fixing side, a spacing side, outer fixing wall and the outer fixing side, forming a rectangular quadrangle, with the central barrier diagonally crossing its inside.

16. The "PROFILE" according to claim 1, characterized in that the profile (P) has the inner and outer fixing walls, the inner and outer fixing sides, and the fixing tab (F) have holes as fixing means.

17. The "PROFILE" according to claim 16, characterized in that the profile (P) has a combination of circular, rectangular and semi-oblong holes as fixing means.

18. The "PROFILE" according to claim 1, characterized in that the profile (P) is built in a single folded plate, presenting the a reinforcement tab as one of its ends and the an outer tab as its other end and without the use of welding.

19. The "PROFILE" according to claim 1, characterized in that the profile (P) does not exceed 25 mm in width (L).

* * * * *